(12) United States Patent
Tian et al.

(10) Patent No.: US 11,350,544 B2
(45) Date of Patent: May 31, 2022

(54) FLEXIBLE COLD PLATE WITH PARALLEL FLUID FLOW PATHS

(71) Applicant: International Business Machines Corporation, Armonk, NY (US)

(72) Inventors: Shurong Tian, Mount Kisco, NY (US); Todd Edward Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 16/827,833

(22) Filed: Mar. 24, 2020

(65) Prior Publication Data
US 2021/0307195 A1    Sep. 30, 2021

(51) Int. Cl.
H05K 7/20 (2006.01)
H01L 23/473 (2006.01)
F28F 3/04 (2006.01)

(52) U.S. Cl.
CPC ......... *H05K 7/20254* (2013.01); *F28F 3/044* (2013.01); *H01L 23/473* (2013.01); *F28F 2255/02* (2013.01)

(58) Field of Classification Search
CPC ..... F28F 3/044; F28F 2255/02; H01L 23/473; H05K 7/20254; H05K 7/20281
See application file for complete search history.

(56) References Cited

U.S. PATENT DOCUMENTS

| 5,369,301 | A | 11/1994 | Hayashi et al. | |
|---|---|---|---|---|
| 5,963,425 | A * | 10/1999 | Chrysler | H05K 7/20836 165/104.33 |
| 8,736,048 | B2 | 5/2014 | Schultz | |
| 2007/0091569 | A1* | 4/2007 | Campbell | H01L 23/4338 361/699 |
| 2007/0119574 | A1* | 5/2007 | Olesen | H01L 23/473 165/100 |
| 2011/0232887 | A1* | 9/2011 | Zaffetti | H05K 7/20254 165/185 |
| 2015/0369545 | A1* | 12/2015 | Naritomi | H05K 7/20872 165/76 |
| 2016/0290727 | A1* | 10/2016 | Coteus | H01L 23/473 |
| 2016/0290728 | A1 | 10/2016 | Coteus et al. | |
| 2017/0324132 | A1* | 11/2017 | Kenney | F28F 3/046 |
| 2019/0222018 | A1* | 7/2019 | Reiter | H05K 7/20927 |

(Continued)

FOREIGN PATENT DOCUMENTS

| CN | 105682431 | 6/2016 |
|---|---|---|
| WO | 2013151526 | 10/2013 |
| WO | 2019115963 | 6/2019 |

*Primary Examiner* — Eric S Ruppert
*Assistant Examiner* — Hans R Weiland
(74) *Attorney, Agent, or Firm* — Daniel Morris; Otterstedt, Wallace & Kammer, LLP

(57) ABSTRACT

A cold plate apparatus includes a top wall and a bottom wall that enclose a plenum for fluid flow; an inlet and an outlet each formed in one of the top wall or the bottom wall; a first active area within the plenum; a second active area within the plenum; and a partition that extends between the top wall and the bottom wall within the plenum and that separates the first active area from the second active area so that a portion of fluid flowing from the inlet to the outlet through the plenum flows through either the first active area or the second active area but not through both active areas.

16 Claims, 18 Drawing Sheets

(56) References Cited

U.S. PATENT DOCUMENTS

2019/0364694 A1* 11/2019 Lin ...................... H01L 23/473
2021/0122263 A1*  4/2021 Dziubinschi .......... F28D 9/0081
2021/0254895 A1*  8/2021 Vakilimoghaddam .. F28F 3/044

* cited by examiner

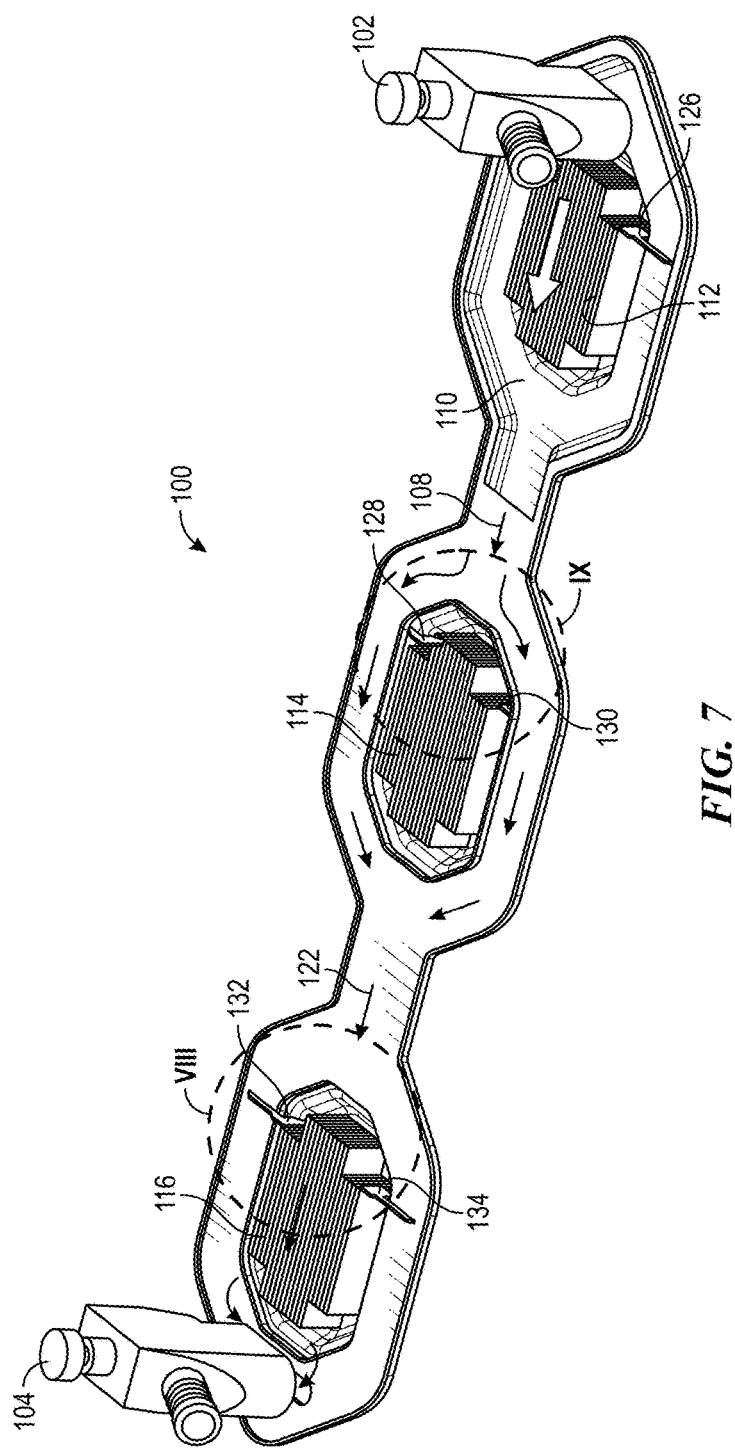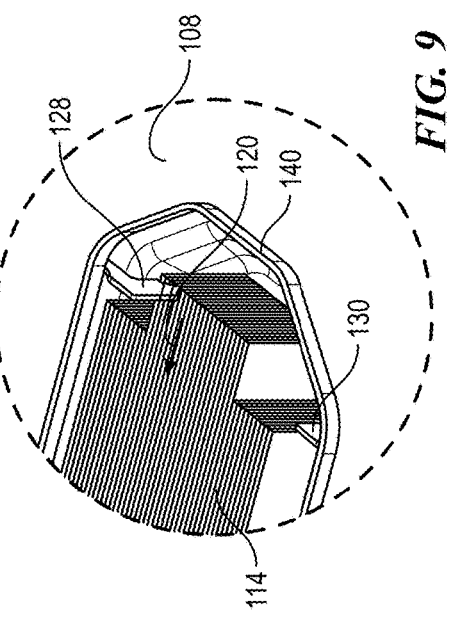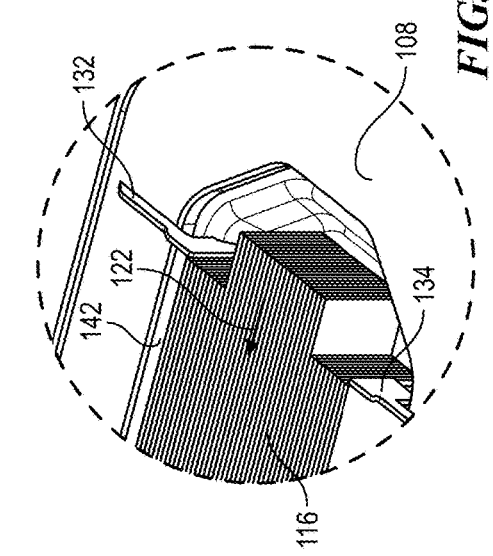

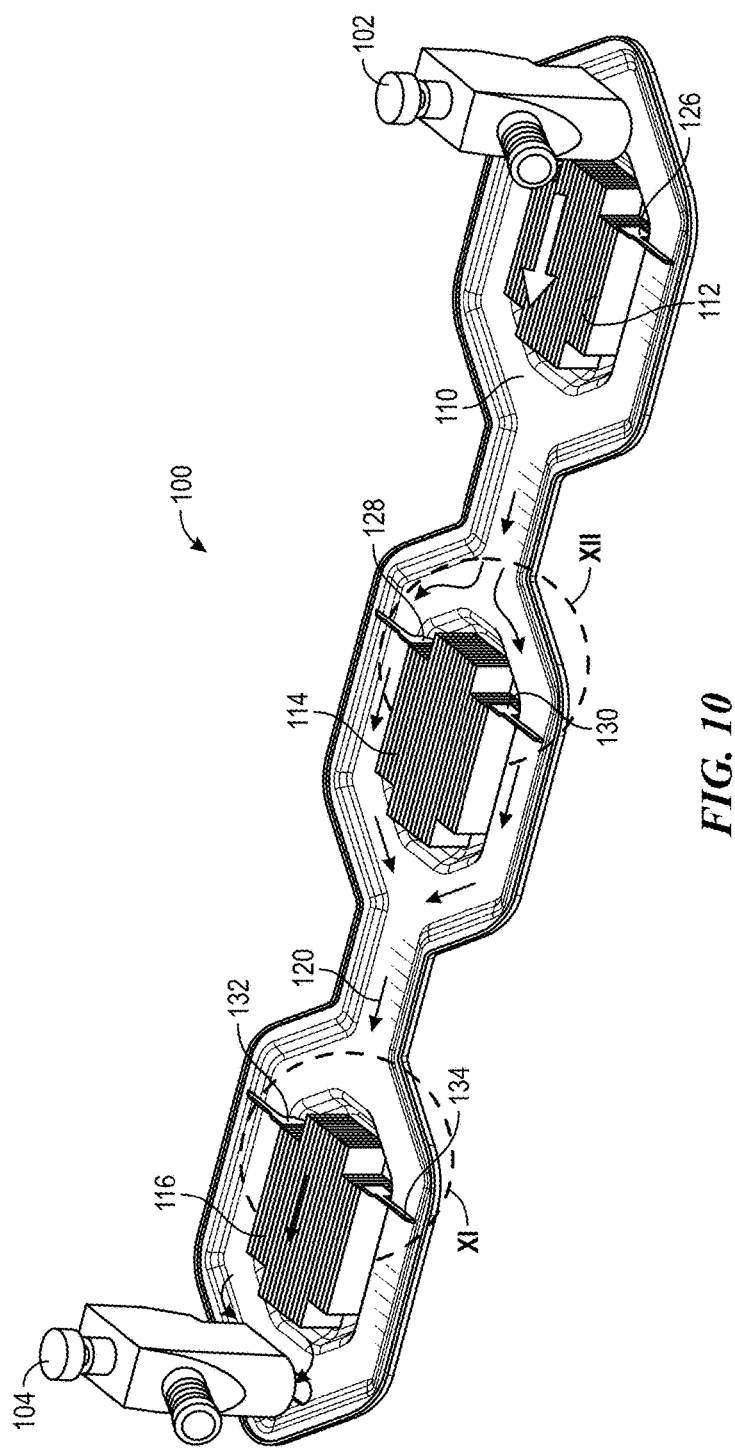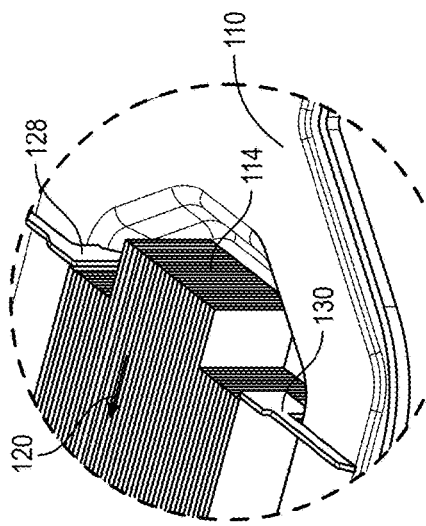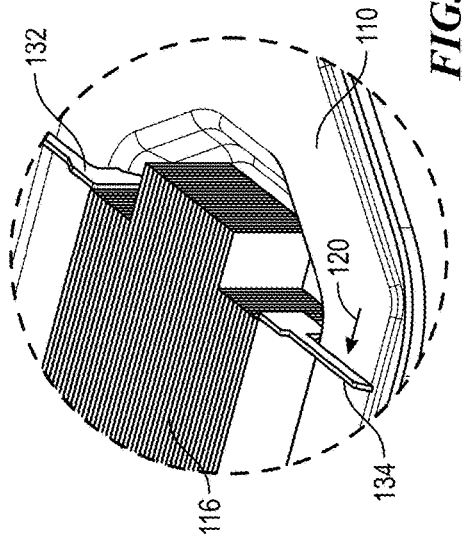

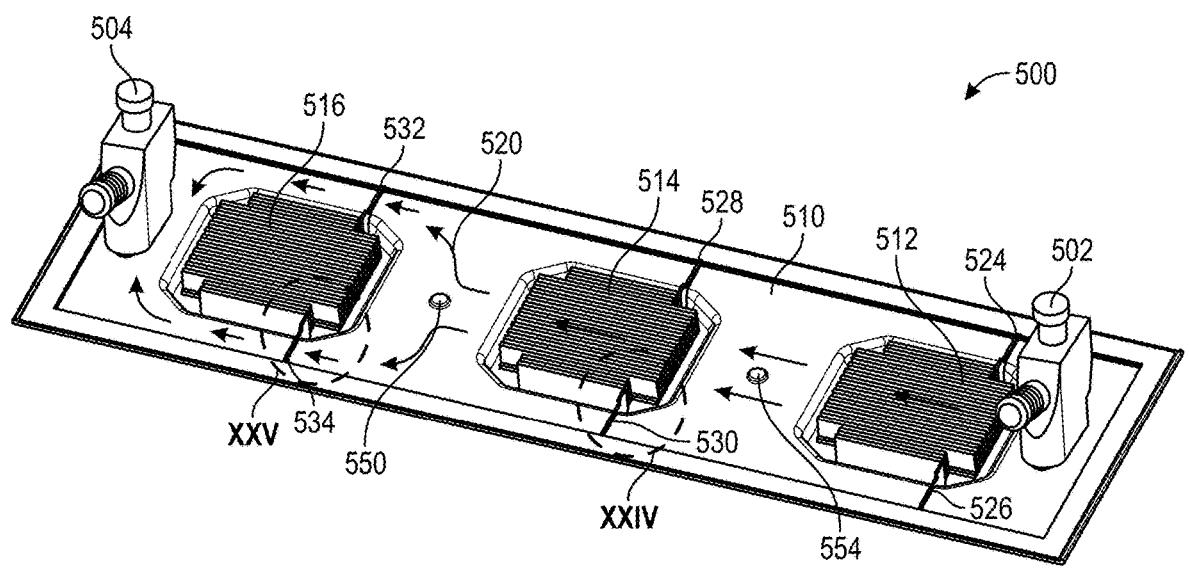
FIG. 23
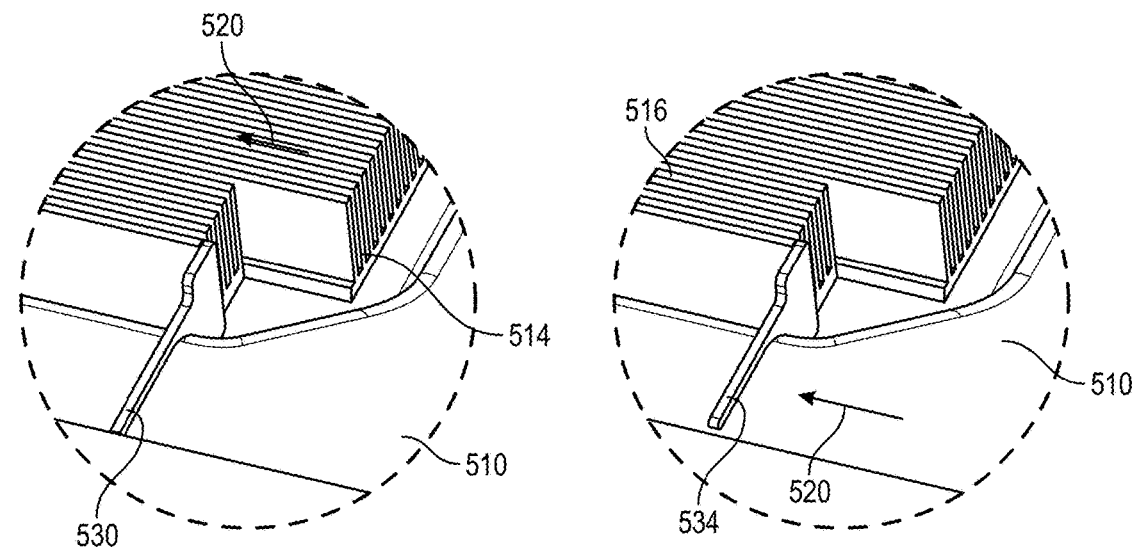
FIG. 24     FIG. 25

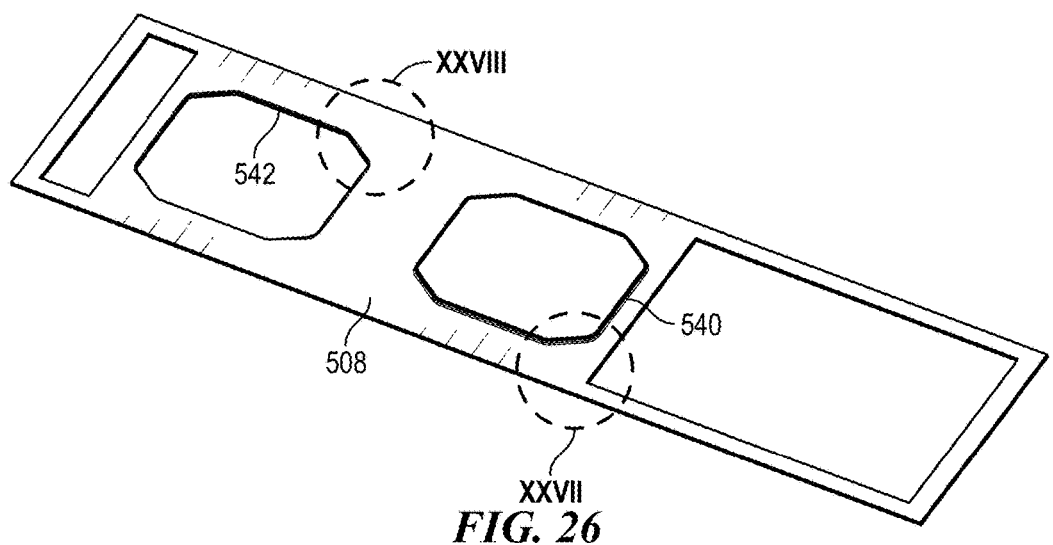
*FIG. 26*
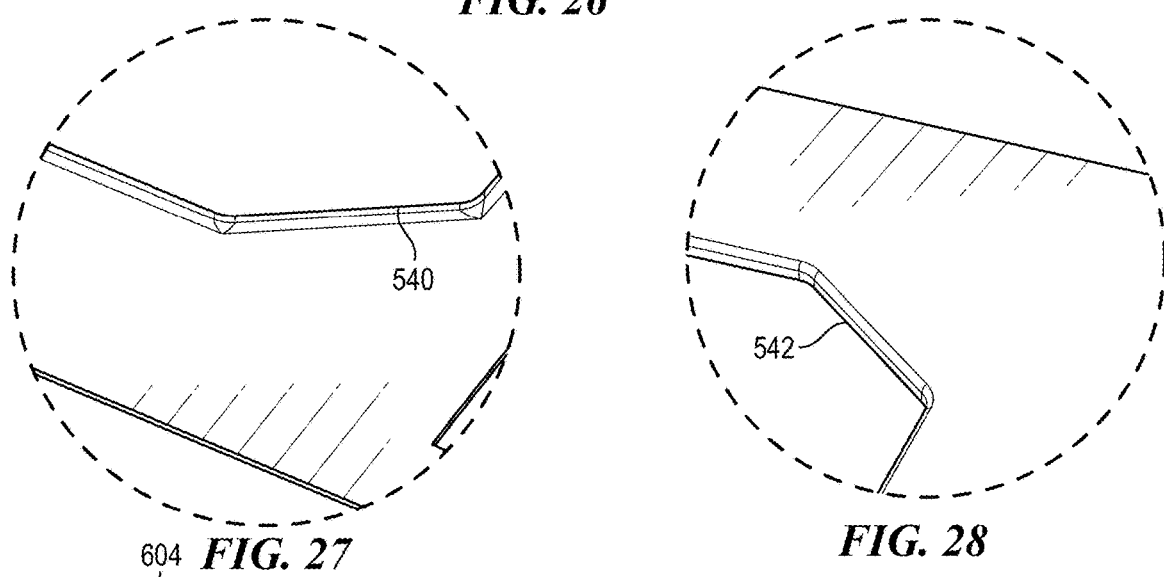
*FIG. 27*  *FIG. 28*
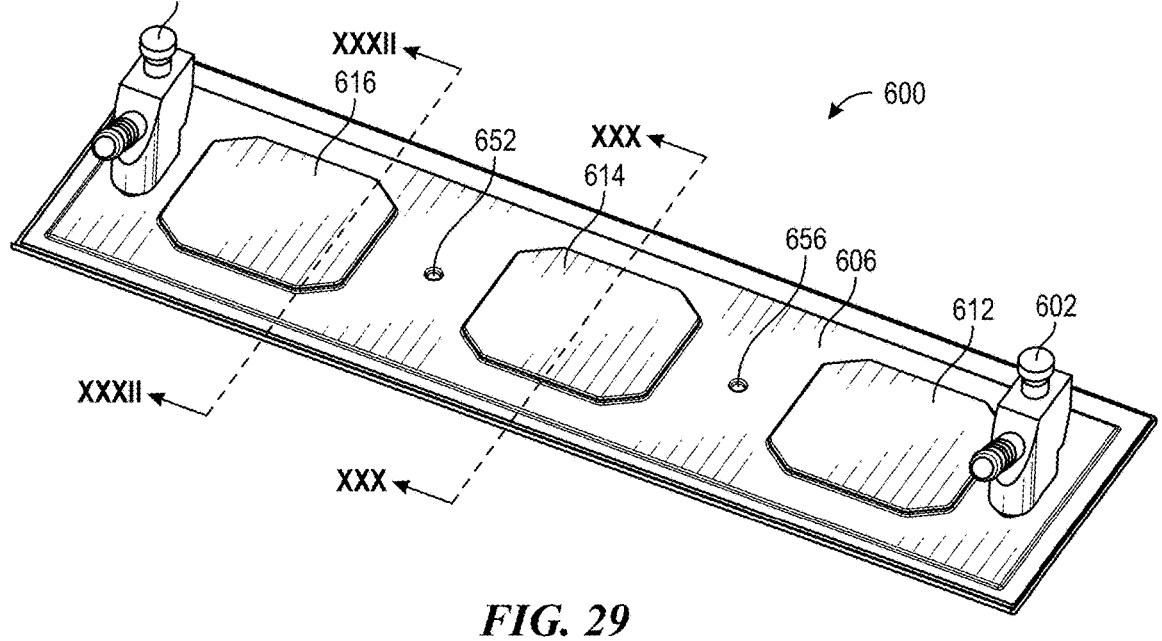
*FIG. 29*

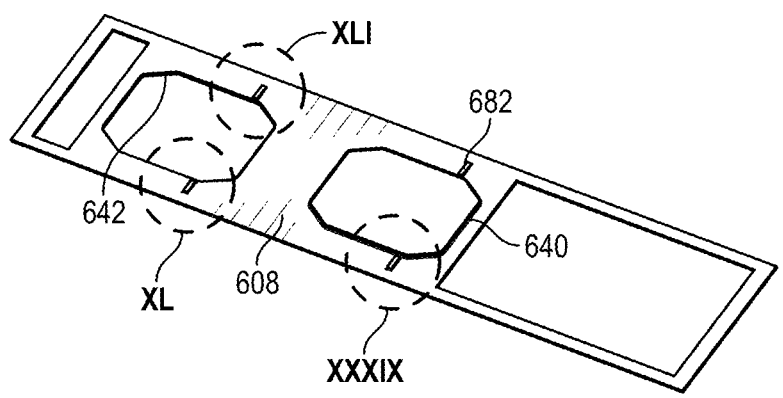
*FIG. 38*
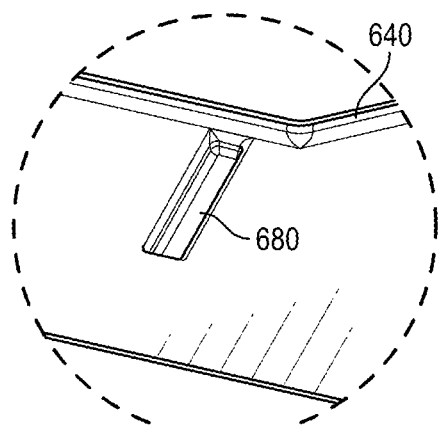 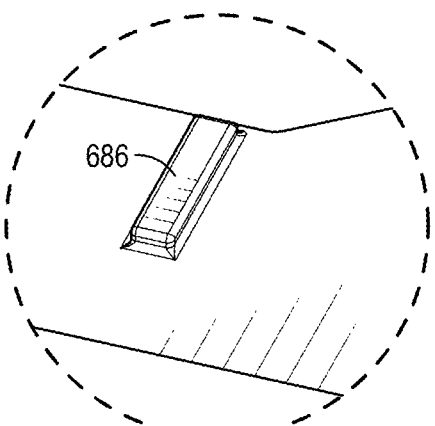
*FIG. 39*  *FIG. 40*
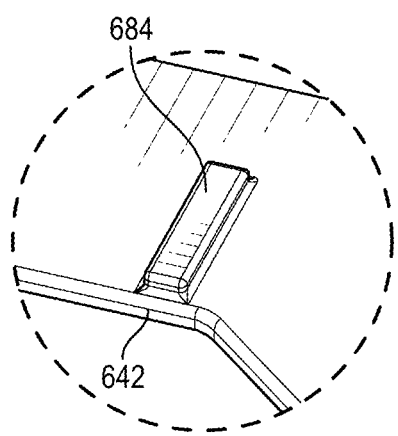
*FIG. 41*

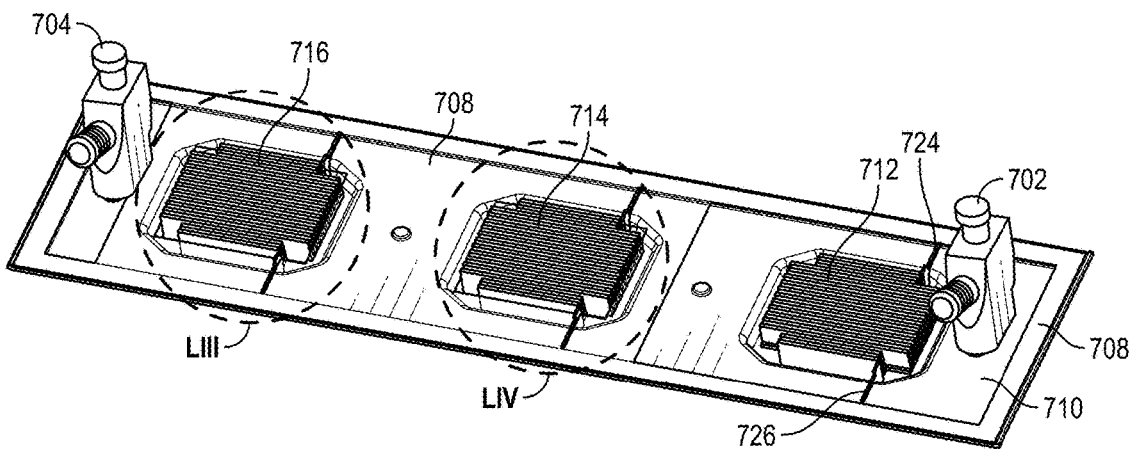
*FIG. 52*
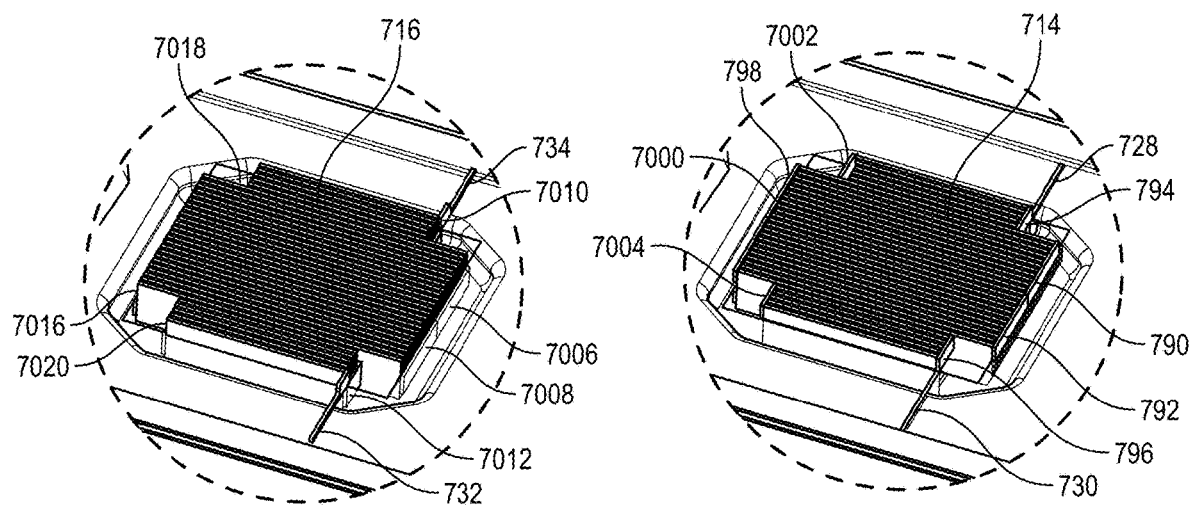
*FIG. 53*
*FIG. 54*
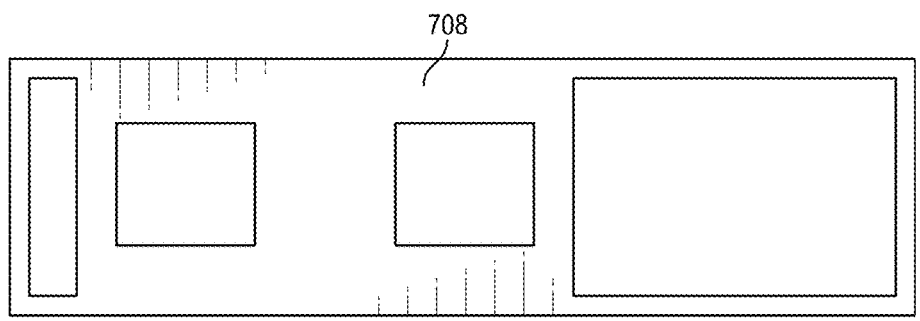
*FIG. 55*

FLEXIBLE COLD PLATE WITH PARALLEL FLUID FLOW PATHS

BACKGROUND

Embodiments of the invention relate to the electrical, electronic, and computer arts, and more specifically, to cooling of components assembled on printed circuit boards.

Electronic components have often been assembled in relatively simple configurations, e.g., coplanar on one side of a common printed circuit board. Using a single flexible cold plate to cool multiple electronic components can result in cost savings.

SUMMARY

Principles of the invention provide techniques for a flexible cold plate with parallel fluid flow paths. Flex regions of the cold plate serve as plena that provide parallel cooling fluid flow between active areas of the cold plate. Embodiments of the invention preserve the low cost advantage of using a single flexible cold plate to cool multiple heat generating devices, while the parallel fluid flow mitigates having one device preheat another.

According to an aspect of the invention, an exemplary cold plate includes a top wall and a bottom wall that enclose a plenum for fluid flow; an inlet and an outlet each formed in one of the top wall or the bottom wall; a first active area within the plenum; a second active area within the plenum; and a partition that extends between the top wall and the bottom wall within the plenum and that separates the first active area from the second active area so that a portion of fluid flowing from the inlet to the outlet through the plenum flows through either the first active area or the second active area but not through both active areas.

According to another aspect, an exemplary cold plate apparatus includes a top wall and a bottom wall that enclose a plenum; an inlet and an outlet each formed in one of the top wall and the bottom wall and connected in fluid communication with the plenum; a first active area formed in the plenum; a second active area formed in the plenum; flexible portions of the top wall and the bottom wall that connect the first active area to the second active area; a middle wall extending between the first active area and the second active area between the flexible portions of the top wall and the bottom wall; a first flow region enclosed by at least the top wall and the middle wall so that fluid in the first flow region flows from the inlet to the outlet through the first active area but not through the second active area; and a second flow region enclosed by at least the middle wall and the bottom wall so that fluid in the second flow region flows from the inlet to the outlet through the second active area but not through the first active area.

According to another aspect, a method for cooling electronic components includes providing a first electronic component and a second electronic component each mounted to a circuit board; positioning a cold plate apparatus with a first active area of the cold plate apparatus adjacent to the first electronic component and with a second active area of the cold plate apparatus adjacent to the second electronic component; and flowing fluid through the cold plate apparatus such that the flow is divided into separate, parallel paths wherein fluid flows within a single path through either the first active area or the second active area but not through both active areas.

In view of the foregoing, techniques of the present invention can provide substantial beneficial technical effects. For example, one or more embodiments provide efficient cooling of multiple electronic components using a single cold plate with increased uniformity of temperature across the components.

These and other features and advantages of the present invention will become apparent from the following detailed description of illustrative embodiments thereof, which is to be read in connection with the accompanying drawings.

BRIEF DESCRIPTION OF THE DRAWINGS

FIGS. 7-9 show internal views of the flexible cold plate of FIG. 1 with top wall removed. An upper level fluid flow path is shown.

FIGS. 10-12 show internal views of the flexible cold plate of FIG. 1 with top and middle walls removed. A lower level fluid flow path is shown.

FIGS. 23-25 show internal views of the flexible cold plate of FIG. 13 with top and middle walls removed. Dimples in the bottom wall are visible.

FIGS. 26-28 show a detailed middle wall of the flexible cold plate of FIG. 13.

FIG. 29 shows an external view of a flexible cold plate.

FIGS. 39-41 show a detailed middle wall with bent features of the flexible cold plate of FIG. 29.

FIGS. 52-54 show the flexible cold plate of FIG. 42 with top wall removed.

FIG. 55 shows the middle wall within the flexible cold plate of FIG. 42.

Multiple, parallel fluid flow paths are shown, separated by indentations formed in top and bottom walls.

DETAILED DESCRIPTION

The power consumption of electronic components has been increasing. When cooling components using series fluid flow, an increase in the power of an upstream component will cause fluid preheating and will lead to an increase in the temperature of downstream components. Reducing or eliminating this preheating by using parallel fluid flow paths will lower the temperature of the hottest system component. This can improve system performance and may lower overall data center energy cost. Accordingly, embodiments of the disclosure provide flexible cold plates that have multiple fluid flow paths to cool each active area with less preheating from upstream components.

Figure 1:
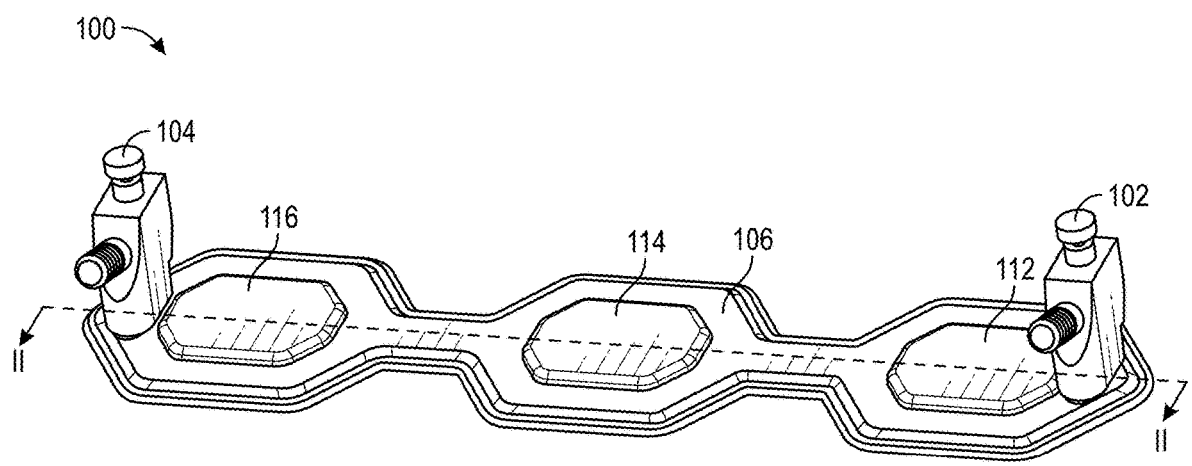
FIG. 1 shows an external view of a flexible cold plate having vertically separated, internal, parallel fluid flow paths.

FIG. 1 shows an external view of a flexible cold plate 100 having vertically separated, internal, parallel fluid flow paths. The liquid flows from inlet 102 to outlet 104. There are two layers of liquid flow path inside of the cold plate. Each of the liquid flow paths passes through some but not all of three active areas 116, 114, 112. The liquid flow paths are in a plenum that is enclosed by a top wall 106 and a bottom wall (shown in FIGS. 2-6) of the cold plate 100. In one or more embodiments, an active area includes fins, pins, or other structures that enhance heat transfer from the top wall 106 and/or the bottom wall into the fluid flowing from the inlet 102 to the outlet 104 (heat-dissipating electronic devices are directly and/or indirectly thermally coupled to the top and/or bottom walls).

Figure 2:
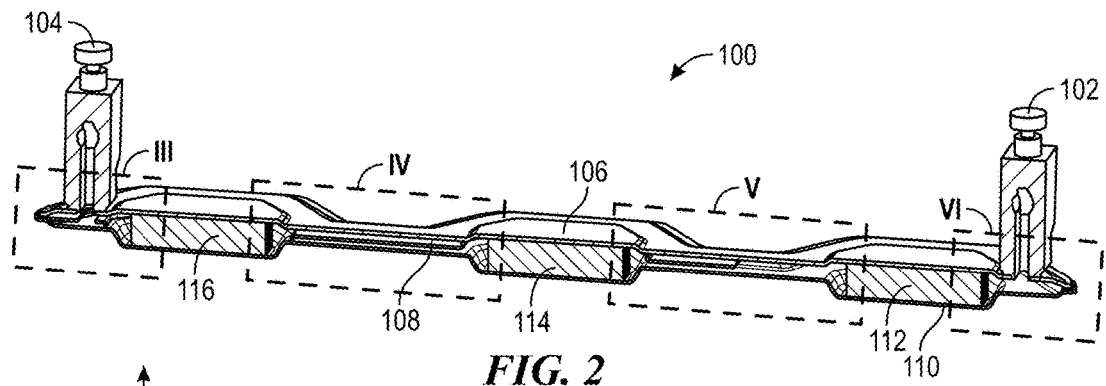
FIGS. 2-6 show cross-section views of the flexible cold plate of FIG. 1 along the fluid flow direction, showing how a middle wall or partition is used to separate fluid flow paths.
Figure 3:
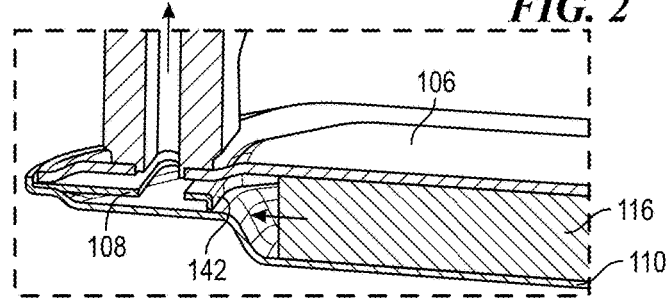
Figure 4:
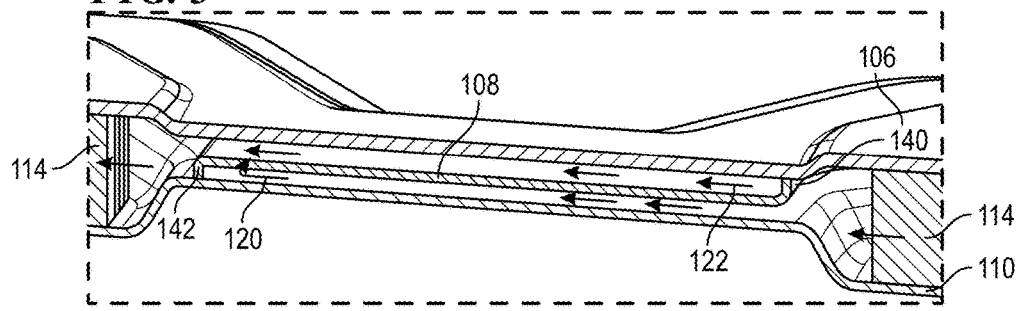
Figure 5:
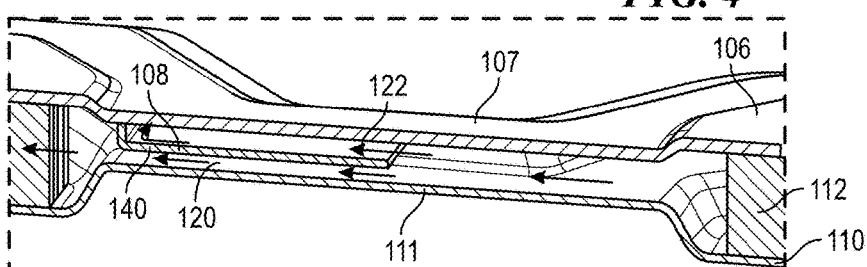
Figure 6:
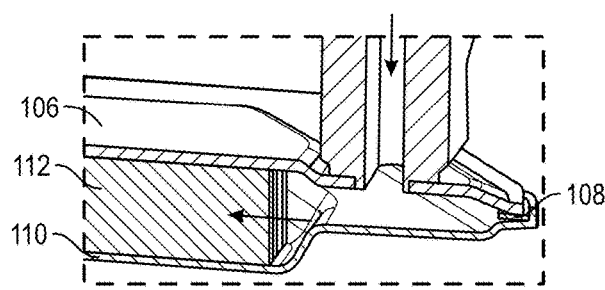

FIGS. 2-6 show cross-section views of the flexible cold plate 100 along the fluid flow direction, showing how a partition or middle wall 108 is used to separate fluid flow paths to active areas 112, 114, 116. FIG. 2 is a section of FIG. 1 taken at the view line II-II. FIGS. 3, 4, 5, and 6 are details of FIG. 2 at circles III, IV, V, and VI respectively. The major section of the middle wall extends parallel to the major sections of the top wall 106 and the bottom wall 110. The fluid flows from the inlet 102 to the first active area 112. Then, in a plenum area between the first active area 112 and middle active area 114, the middle wall 108 separates the fluid into a lower (first) fluid flow path 120 and an upper (second) fluid flow path 122. The first fluid flow path 120 is formed in between the bottom wall 110 and middle wall 108 to cool electronic components underneath the middle active area 114. The second fluid flow path 122 is formed in between the top wall 106 and middle wall 108 to cool electronic components underneath the third active area 116. The middle wall has flow guides 140 and 142 to guide the fluid flow to different active areas. Flow guide 140 directs the upper fluid flow around the middle active area 114. Flow guide 142 directs the lower fluid flow around the third active area 116. Note that "first," "middle," and "third" all are arbitrary designators and that the active areas could be arranged in any order. The top wall 106 has at least a first flexible portion 107 between the first active area 112 and the middle active area 114, and the bottom wall 110 has a corresponding flexible portion 111.

FIGS. 7-9 show internal views of the flexible cold plate 100 with top wall removed. FIGS. 8 and 9 are details of FIG. 7 at circles VIII and IX respectively. The upper level fluid flow path 122 is shown. The upper fluid flow path 122 flows in between the top wall 106 (omitted in FIGS. 7-9) and middle wall 108 around the middle active area 114 and through the third active area 116 to the outlet barb fitting 104. The fluid blockers 132 and 134 prevent the fluid in the upper flow path 122 from bypassing the third active area 116 while the ring flow guide 142 prevents the fluid in the lower flow path 120 from entering the third active area. The fluid blocker 126 is one of two blockers that enforce fluid flow to the first active area 112 without fluid bypass. The lower fluid flow path 120 flows in between the middle wall 108 and the bottom wall 110 through the middle active area 114 and around the third active area 116 to the outlet 104. The fluid blockers 128, 130 substantially prevent the fluid in the lower flow path from bypassing the middle active area 114 while the ring flow guide 140 substantially prevents the fluid in the upper flow path entering the middle active area. In one or more embodiments, at least one of the flow blockers 128, 130, 132, 134 is formed by bending a fin of the middle active area 114 outward in a direction parallel to the top and bottom walls 106, 110. In one or more embodiments, there are gaps between the flow blockers 128, 130, 132, 134 and the middle and top or bottom walls 106, 108, 110 and there are gaps between the ring features 140, 142 and the top wall 106 or the bottom wall 110. Despite these gaps, the flow blockers 128, 130 and the ring features 140, 142 divert at least a portion of their respective fluid flows. For example, in one or more embodiments a flow blocker diverts at least 50% of its respective fluid flow. In one or more embodiments a flow blocker diverts at least 65% of its respective fluid flow. In one or more embodiments a flow blocker diverts at least 80% of its respective fluid flow. In one or more embodiments a flow blocker diverts at least 90% of its respective fluid flow. In one or more embodiments a flow blocker diverts at least 95% of its respective fluid flow. In one or more embodiments a flow blocker diverts 100% of its respective fluid flow. In one or more embodiments the gaps are sufficiently small so that viscosity effects prevent substantially all fluid flow through the gaps, i.e. the flow blockers divert substantially all of their respective fluid flows.

The word "substantially," as used throughout this disclosure, implies that a condition is sufficient to fulfill a design purpose of mitigating heat transfer fluid temperature rise as the fluid is diverted from an upstream active area and is admitted to a downstream active area, or flows across an upstream active area and is diverted from a downstream active area. In one or more embodiments, sufficient mitigation of fluid temperature rise due to preheating could be achieved by limiting the bypass fluid temperature rise to be less than 10% of the total fluid temperature rise between the inlet 102 and outlet 104.

FIGS. 10-12 show internal views of the flexible cold plate 100 with top wall and middle wall removed. FIGS. 11 and 12 are details of FIG. 10 at circles XI and XII respectively. The lower level fluid flow path 120 is shown. The lower fluid flow path 120 flows in between the bottom wall 110 and the middle wall to the middle active area 114 then through the third active area 116 to the outlet barb fitting 104. The fluid blockers 128 and 130 direct the fluid through the middle active area 114.

Figure 13:
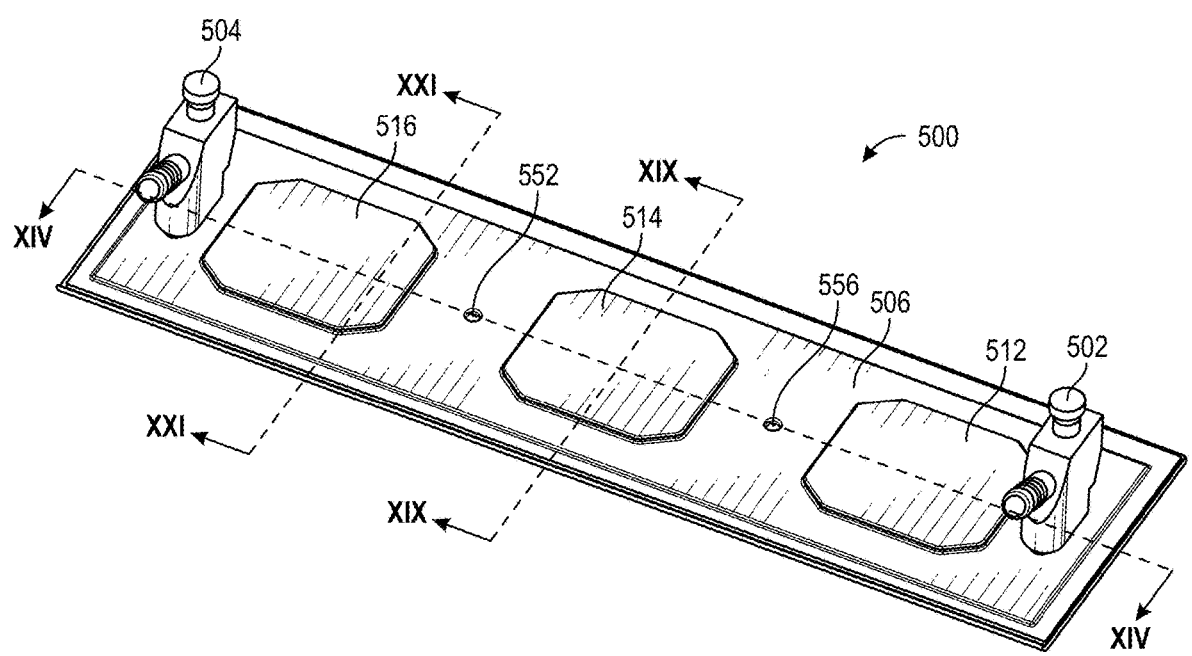
FIG. 13 shows an external view of a flexible cold plate, showing dimples used to maintain separation between walls.

FIG. 13 shows an external view of a flexible cold plate 500, showing dimples 552 and 556 used to maintain separation between walls. Components of FIGS. 13-28 that are similar to those of FIGS. 1-12 are similarly numbered, but with a "5" prefix instead of a "1," and if not described may be presumed identical to those of FIGS. 1-12.

Figure 14:
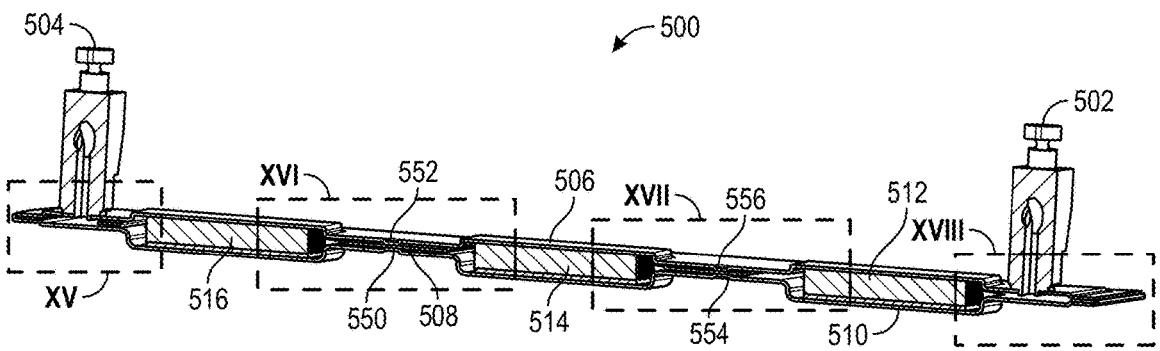
FIGS. 14-18 show cross-section views of the flexible cold plate of FIG. 13 along the fluid flow direction, showing how dimples are used to maintain separation between walls.
Figure 15:
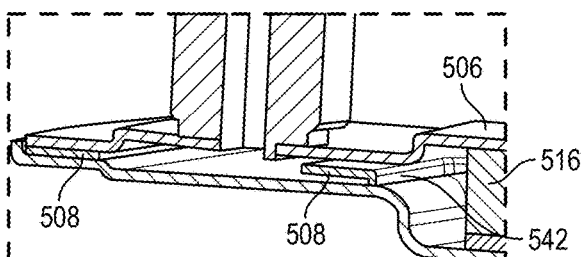
Figure 16:
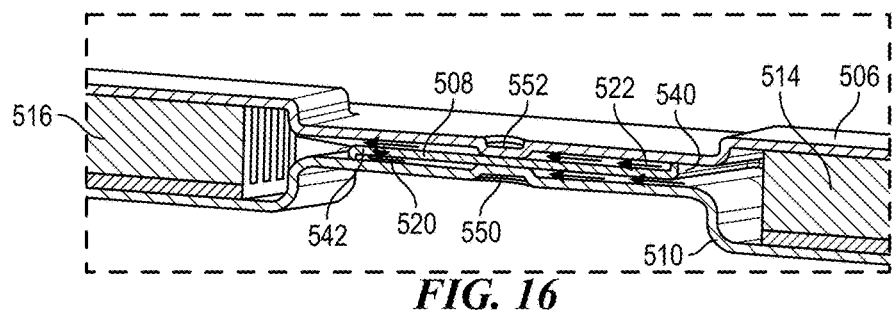
Figure 17:
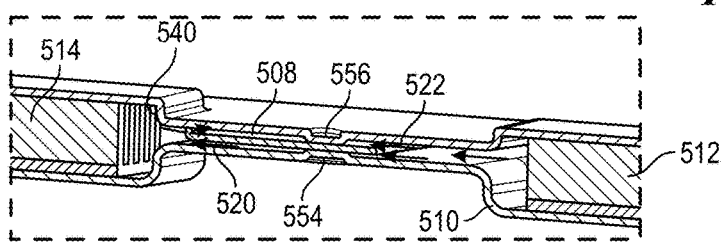
Figure 18:
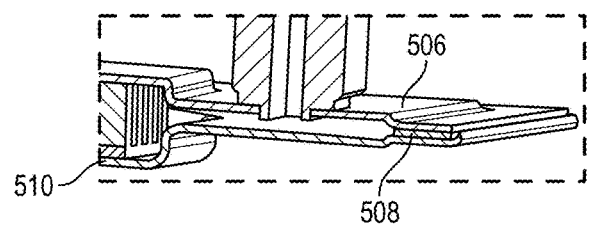

FIGS. 14-18 show cross-section views of the flexible cold plate 500 along the fluid flow direction, showing how dimples 550, 552, 554, 556 maintain separation between the top and bottom walls 506, 510. FIG. 14 is a sectional view of FIG. 13 at view line XIV-XIV. FIGS. 15, 16, 17, and 18 are details of FIG. 14 at circles XV, XVI, XVII, and XVIII respectively. Similar as shown in FIGS. 1-12, the fluid flows from the inlet 502 to the first active area 512, then is separated into the upper fluid flow path 522 and the lower fluid flow path 520 by the middle wall 508 in the plenum area between the first active area 512 and the middle active area 514. Dimples 550, 552, 554, 556 maintain separation between the top and bottom walls 506, 510. The lower fluid flow path 520 is formed in between the bottom wall 510 and the middle wall 508 to cool electronic components underneath the middle active area 514. The upper fluid flow path 522 is formed in between the top wall 506 and the middle wall 508 to cool electronic components underneath the third active area 516. The middle wall 508 has ring-like bent flow guides 540 and 542 to guide the fluid flows to different active areas. Flow blockers 524, 526, 528, 530, 532, 534, seen in FIG. 23, aid in directing the fluid through or around the different active areas. The dimples 552, 556 on the top wall and the dimples 550, 554 on the bottom wall join at the middle wall to maintain the fluid flow path geometries. All the fluid exits through the outlet 504.

Figure 19:
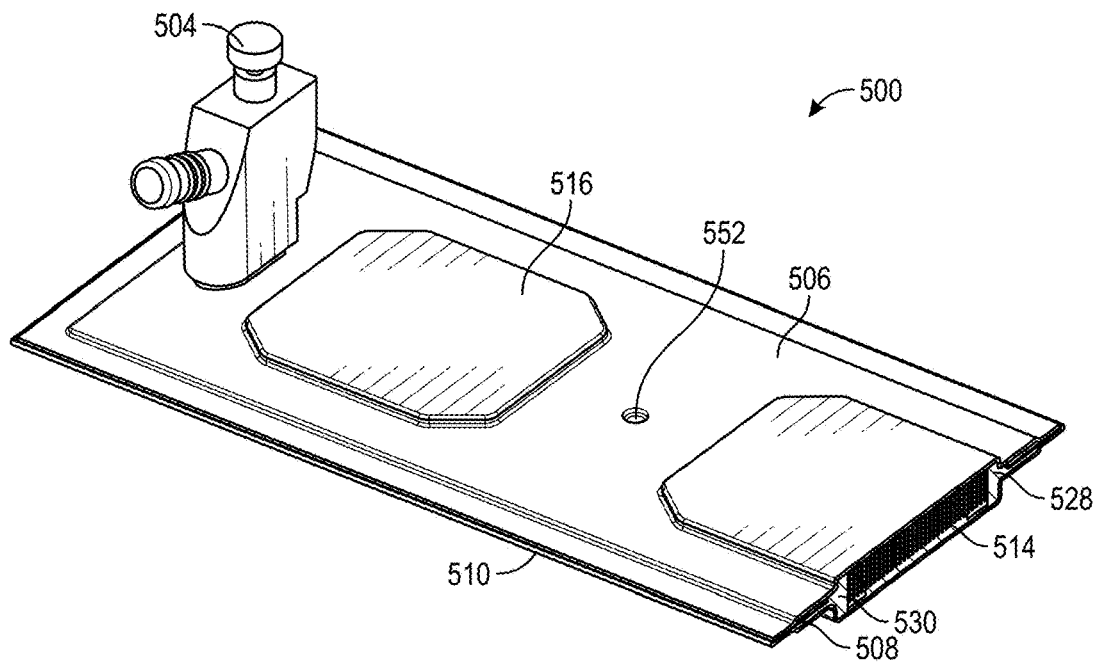
FIGS. 19-22 show cross-section views of the flexible cold plate of FIG. 13 perpendicular to the fluid flow direction, showing how the bent features of middle wall and flow blockers direct the fluid flow to different active areas.
Figure 20:
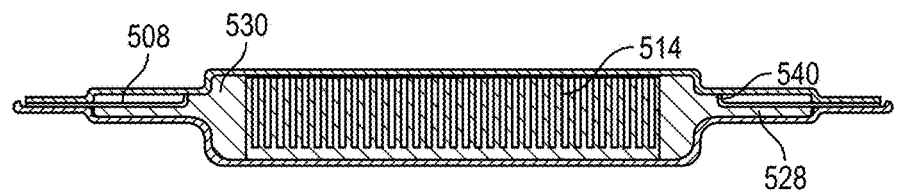
Figure 21:
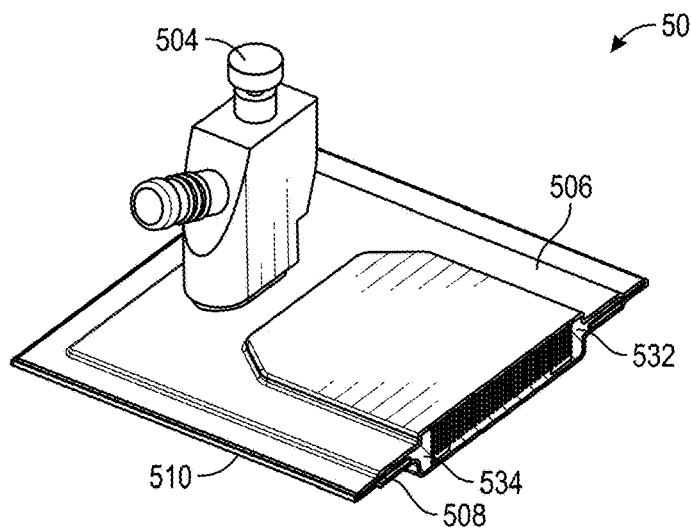
Figure 22:
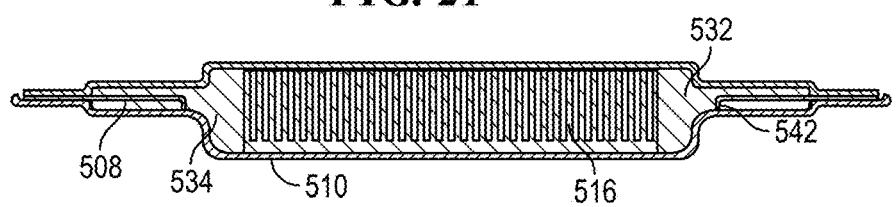

FIGS. 19-22 show cross-section views of the flexible cold plate 500 perpendicular to the fluid flow direction, showing how the bent flow guides 540, 542 of the middle wall 508 work with the flow blockers 528, 530, 532, 534 to direct the fluid flow to active areas 514, 516. FIG. 19 is a cutaway view of FIG. 13 at view line XIX-XIX. FIG. 20 is an end view of FIG. 19. FIG. 21 is a cutaway view of FIG. 13 at view line XXI-XXI. FIG. 22 is an end view of FIG. 20. Referring particularly to FIGS. 19 and 20, the bent flow guide 540 and the flow blockers 528, 530 cooperate to cause fluid flowing below the middle wall 508 to flow through the middle active area 514, while the bent flow guide 540 diverts fluid flowing above the middle wall 508 to flow around the middle active area 514. Referring particularly to FIGS. 21 and 22, the bent flow guide 542 and the flow blockers 532, 534 cooperate to cause fluid flowing above the middle wall 508 to flow through the third active area 516, while the bent flow guide 542 diverts fluid flowing below the middle wall 508 to flow around the third active area 516.

FIGS. 23-25 show internal views of the flexible cold plate 500 with top and middle walls removed. FIGS. 24 and 25 are details of FIG. 23 at circles XIV and XV respectively. Dimples 550, 554 in the bottom wall 510 are visible. FIG. 23 depicts how almost the entirety of the fluid flows through the first active area 512. Then a lower portion of the fluid flows below the middle wall 508, through the middle active area 514 (as shown in FIG. 24) and around the third active area 516 (as shown in FIG. 25).

FIG. 26-28 shows the middle wall 508 within the flexible cold plate 500 with the bending flow guides 540, 542 in the active area to direct the fluid flow directions. FIGS. 27 and 28 are details of FIG. 26 at circles XVII and XVIII respectively. Wall 540 is bent upward, as shown in FIG. 27. Wall 542 is bent downward, as shown in FIG. 28.

FIG. 29 shows an external view of a flexible cold plate 600 with dimples 652, 656. Components of FIGS. 29-37 that are similar to those of FIG. 1-12 or 13-28 are similarly numbered, but with a "6" prefix instead of a "1" or "5," and if not described may be presumed identical to those of FIGS. 1-12. For example, the cold plate 600 includes an inlet 602, an outlet 604, a top wall 606, a first active area 612, a middle active area 614, and a third active area 616 as well as dimples 652, 656. Additionally, as shown in FIGS. 30-33, the cold plate 600 includes a middle wall 608 and a bottom wall 610 that together with the top wall 606 define the active areas and separate the fluid flowing through or around the active areas.

Figure 30:
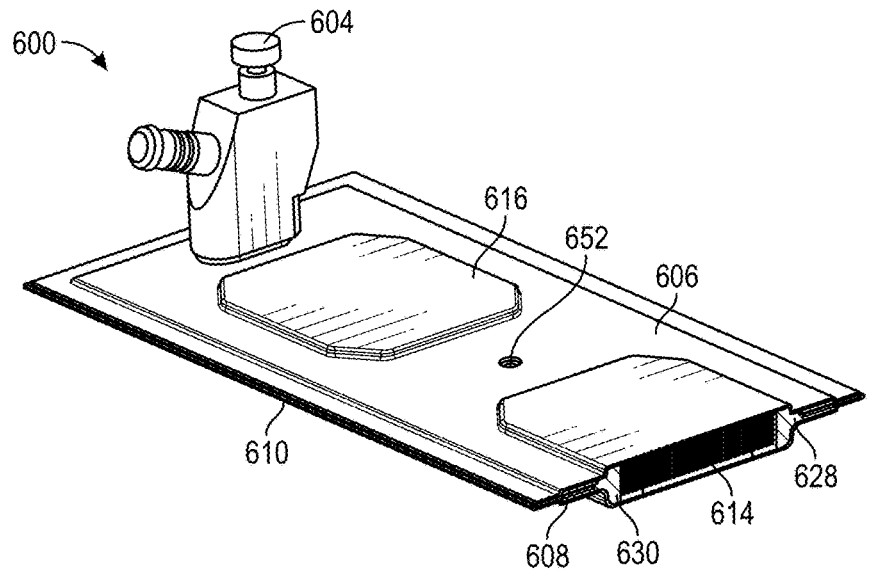
FIGS. 30-33 show cross-section views of the flexible cold plate of FIG. 29 perpendicular to the fluid flow direction, showing middle wall and flow blocker structures.
Figure 31:
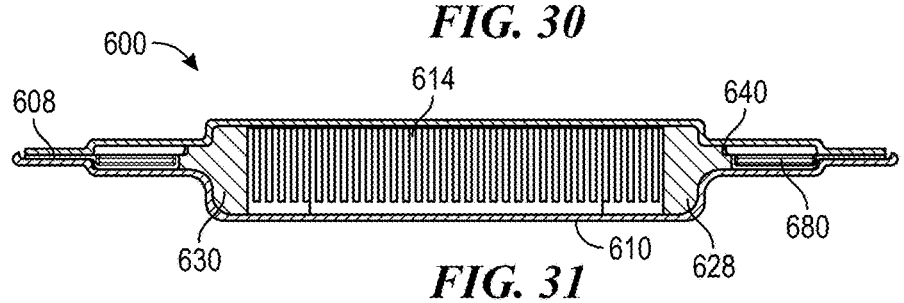
Figure 32:
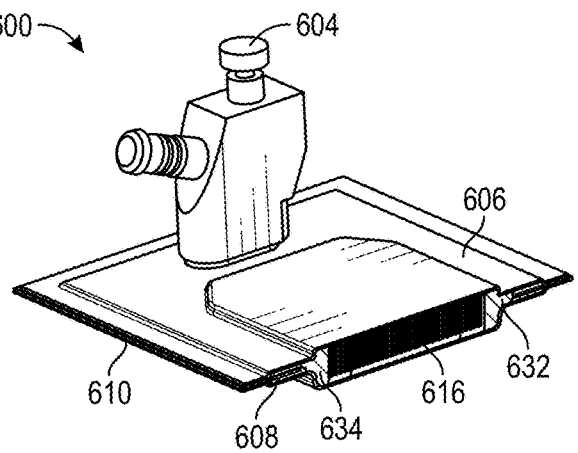
Figure 33:
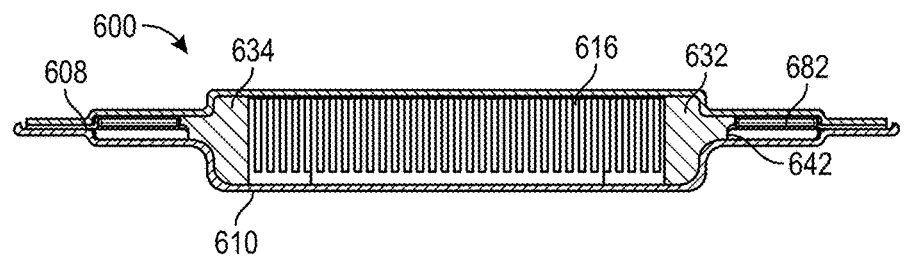
Figure 34:
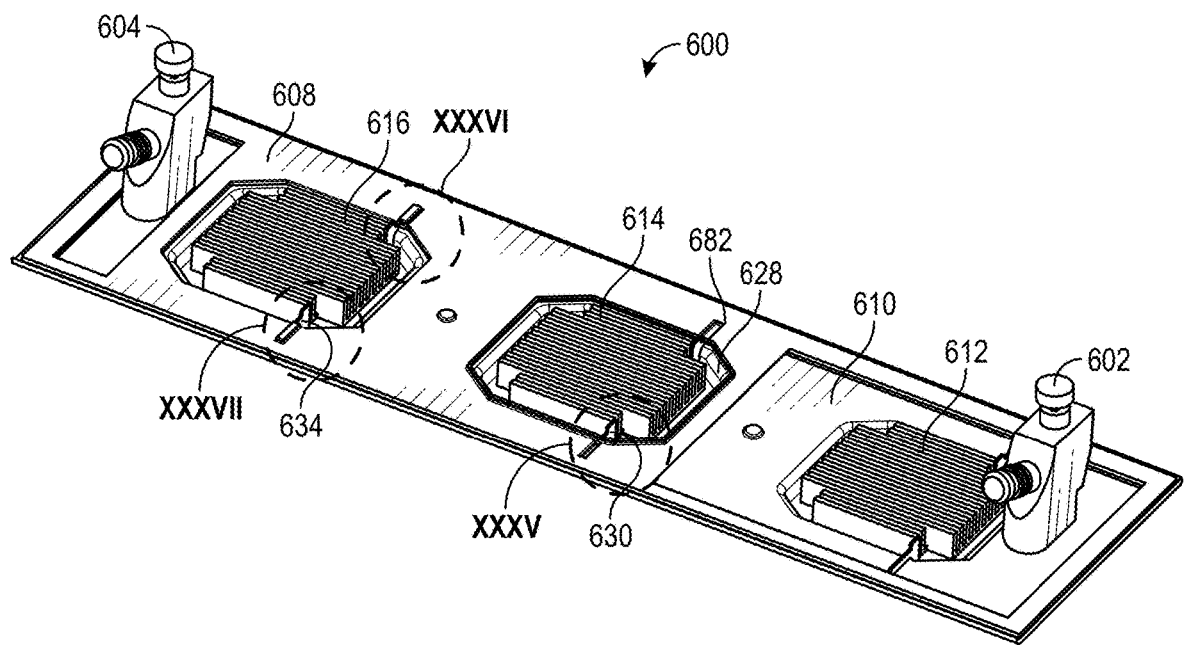
FIGS. 34-37 show internal views of the flexible cold plate of FIG. 29 with top wall removed.

FIGS. 30-33 show cross-section views of the flexible cold plate 600 perpendicular to the fluid flow direction, showing flow guides 640, 680, 642, 682 of the middle wall 608 and flow blockers 628, 630, 632, 634 of the middle active area 614 and of the third active area 616. FIGS. 30 and 32 are cutaway views of FIG. 29 at view lines XXX-XXX and XXXII-XXXII respectively. FIG. 31 is an end view of FIG. 30 and FIG. 33 is an end view of FIG. 32. Generally as discussed above with reference to FIGS. 19-22, the flow blockers 628, 630 cause fluid flowing below the middle wall 608 to flow through the middle active area 614 and the flow guide 640 causes fluid flowing above the middle wall 608 to flow around the middle active area 614, as shown in FIGS. 30 and 31. Similarly, the flow blockers 632, 634 cause fluid flowing above the middle wall 608 to flow through the third active area 616 and the flow guide 642 causes fluid flowing below the middle wall 608 to flow around the third active area 616, as shown in FIGS. 32 and 33.

Figure 35:
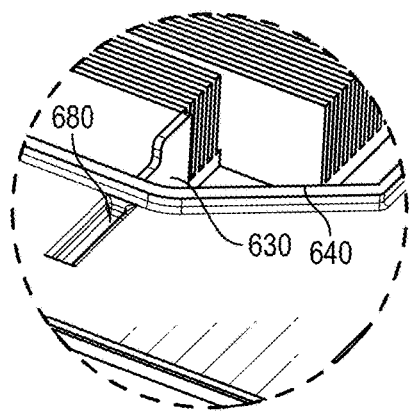
Figure 36:
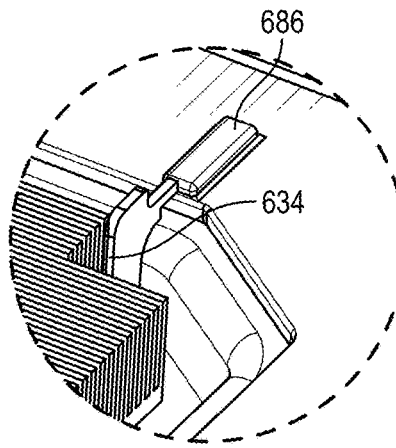
Figure 37:
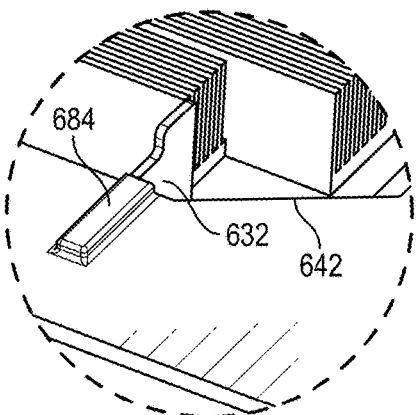

FIGS. 34-37 show internal views of the flexible cold plate 600 with top wall removed. FIGS. 35, 36, and 37 are details of FIG. 34 at circles XXXV, XXXVI, and XXXVII respectively. Flow guide 640 is bent upward above the middle wall 608 while flow guides 680, 682 are bent downward from the middle wall 608 to engage the flow blockers 628 and 630. Flow guide 642 is bent downward below the middle wall 608 while flow guides 684, 686 are bent upward from the middle wall 608 to engage the flow blockers 632, 634.

FIGS. 38-41 show the middle wall 608 with bent flow guides 640, 680, 682, 642, 684, 686. FIGS. 39, 40, and 41 are details of FIG. 38 at circles XXXIX, XL, and XLI respectively.

Figure 42:
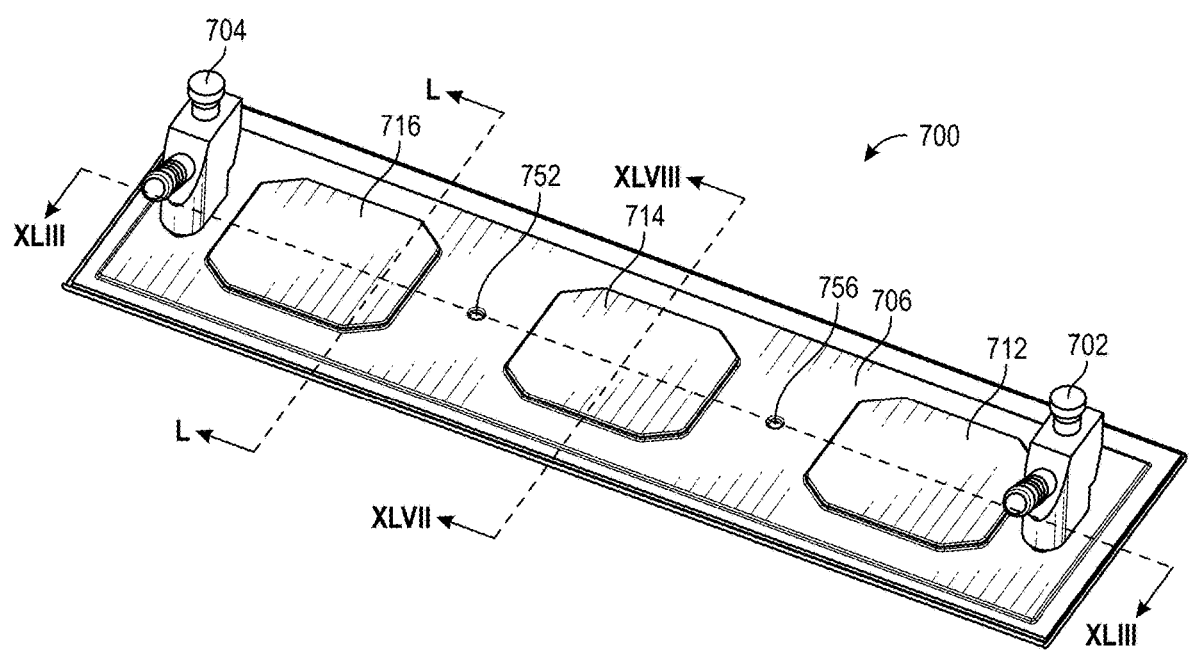
FIG. 42 shows an external view of a flexible cold plate with different internal features.

FIG. 42 shows an external flexible cold plate 700 with inlet 702, outlet 704, top wall 706, fin areas 712, 714, and 716, and dimples 752, 756. Components of FIGS. 42-55 that are similar to those of FIGS. 1-12, 13-28, and 29-41 are similarly numbered, but with a "7" prefix instead of a "1," "5," or "6," and if not described may be presumed identical to those of FIGS. 1-12, 13-28, and 29-41.

Figure 43:
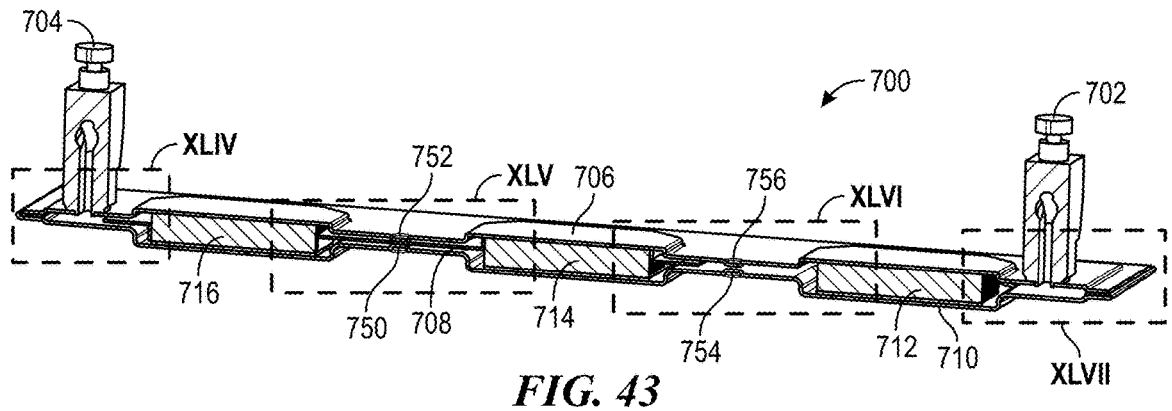
FIGS. 43-47 show cross-section views of the flexible cold plate of FIG. 42 along the fluid flow direction, showing how flow blockers in the active area direct the fluid flow.
Figure 44:
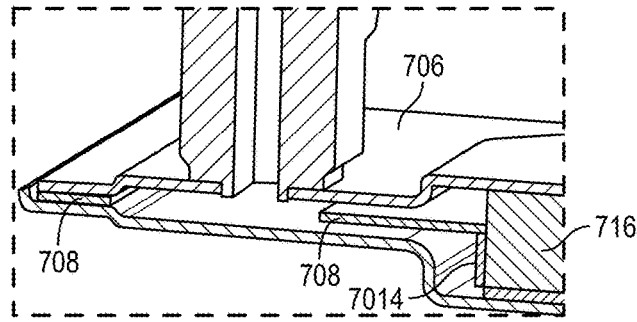
Figure 45:
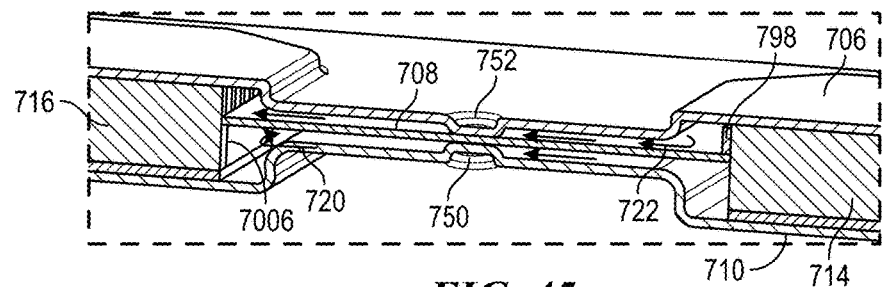
Figure 46:
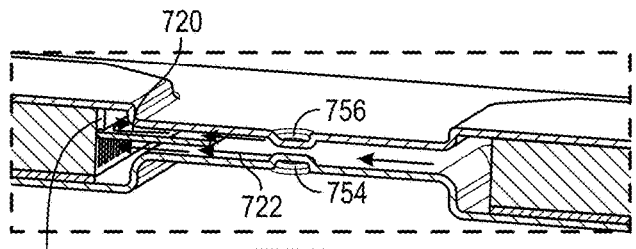
Figure 47:
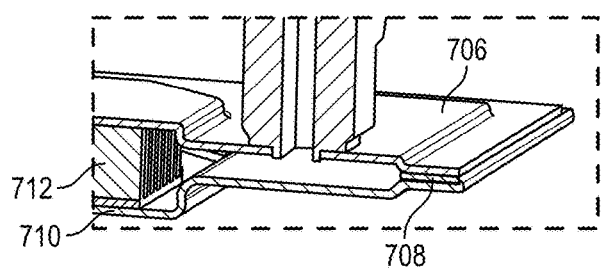

FIGS. 43-47 show cross-section views of the flexible cold plate 700 along the fluid flow direction, showing a middle wall 708 and flow blockers 790, 798, 7006, 7014 direct the fluid flow through or around the active areas 712, 714, 716. FIG. 43 is a cutaway view of FIG. 42 at view line XLIII-XLIII. FIGS. 44-47 are details of FIG. 43 at circles XLIV, XLV, XLVI, and XLVII respectively. Similar as shown in FIGS. 1-12, the fluid flows from the inlet 702 to the first active area 712, then is separated into the upper fluid flow path 722 and the lower fluid flow path 720 by the middle wall 708 in the plenum area between the first active area 712 and the middle active area 714. The lower fluid flow path 720 is formed in between the bottom wall 710 and the middle wall 708 to cool electronic components underneath the middle active area 714. The upper fluid flow path 722 is formed in between the top wall 706 and the middle wall 708 to cool electronic components underneath the third active area 716. Adding the flow blockers 790, 798 and 7006, 7014 on top and bottom of the second and third active areas, respectively, guides the fluid flows to different active areas. Flow blockers 724, 726, 728, 730, 790, 792, 794, 796, 798, 7000, 7002, 7004, 732, 734, 7006, 7008, 7010, 7012, 7016, 7018, 7020, best seen in FIGS. 52-54, aid in directing the fluid through or around the different active areas. The dimples 752, 756 on the top wall and the dimples 750, 754 on the bottom wall join at the middle wall 708 to maintain the fluid flow path geometries. All the fluid exits through the outlet 704.

Figure 48:
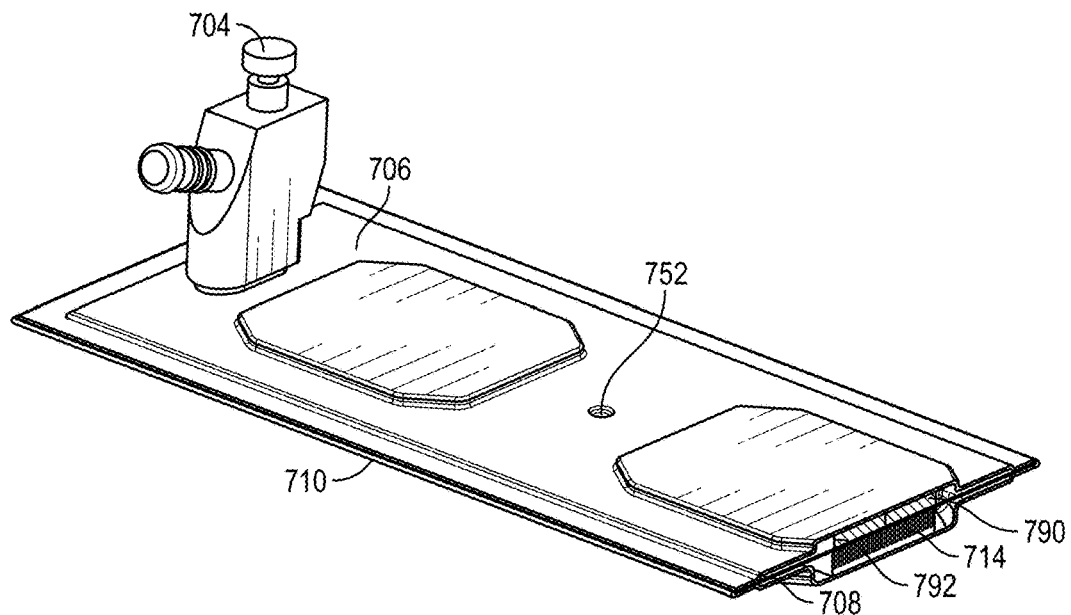
FIGS. 48-51 show cross-section views of the flexible cold plate of FIG. 42 perpendicular to the fluid flow direction, showing how flow blockers direct fluid flow to the active area.
Figure 49:
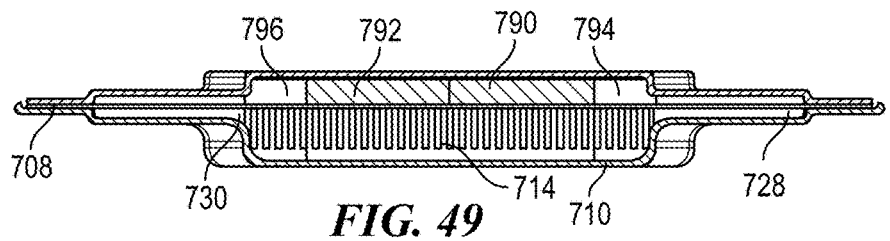
Figure 50:
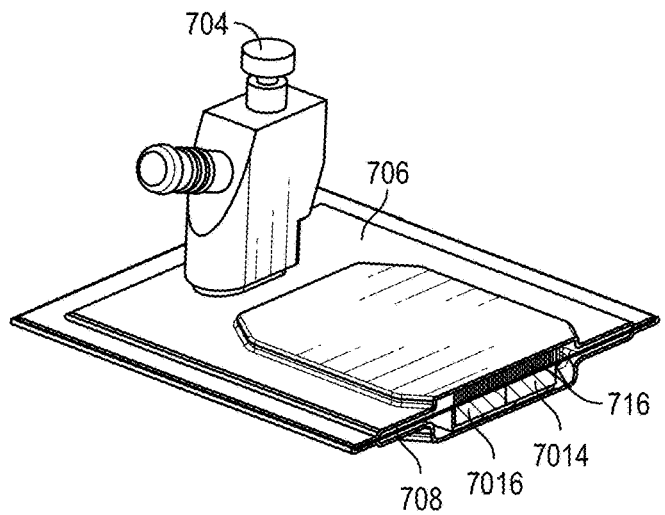
Figure 51:
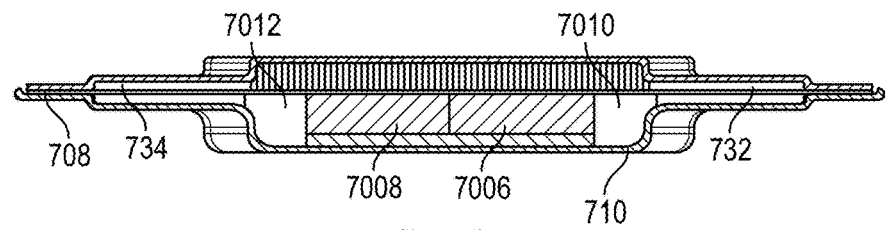

FIGS. 48-51 show cross-section views of the flexible cold plate 700 perpendicular to the fluid flow direction, showing how flow blockers 728, 730, 790, 792, 794, 796, 732, 734, 7014, 7016, 7018, 7020 direct fluid flow through and around the active areas 712, 714, 716. FIGS. 48 and 50 are cutaway views of FIG. 42 at view lines XLVIII-XLVIII and L-L respectively. FIG. 49 is an end view of FIG. 48 and FIG. 51 is an end view of FIG. 50.

FIGS. 52-54 show the flexible cold plate 700 with top wall removed. FIGS. 53 and 54 are details of FIG. 52 at circles LIII and LIV respectively.

FIG. 55 shows the middle wall 708 of the flexible cold plate 700.

Figure 56:
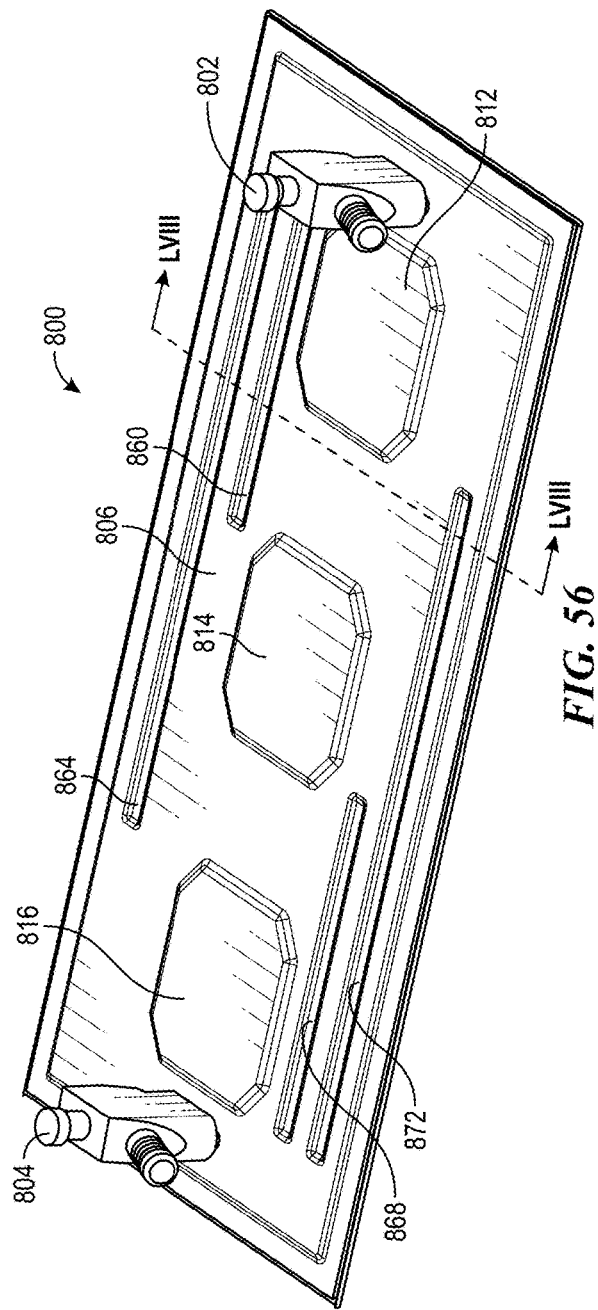
FIG. 56 shows an external view of a flexible cold plate having laterally separated, internal, parallel fluid flow paths, where flow separation is enforced by means of indentations or features formed in top and/or bottom walls.
Figure 57:
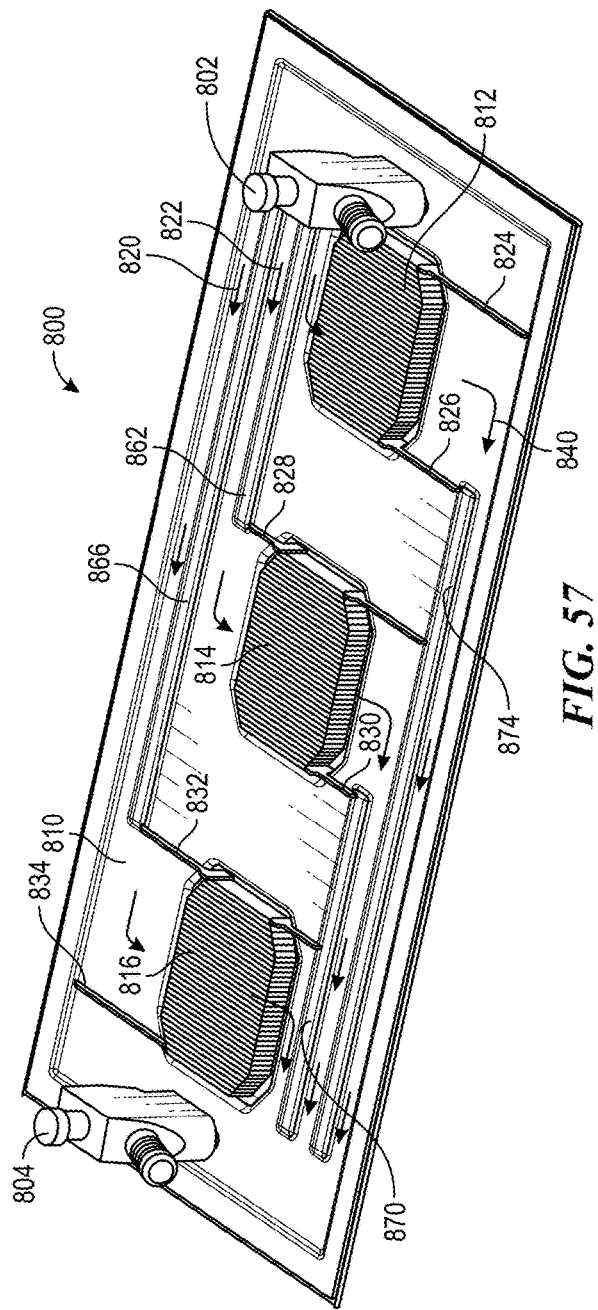
FIG. 57 shows an internal view of the flexible cold plate of FIG. 56, with top wall removed. Multiple, parallel fluid flow paths are shown.
Figure 58:
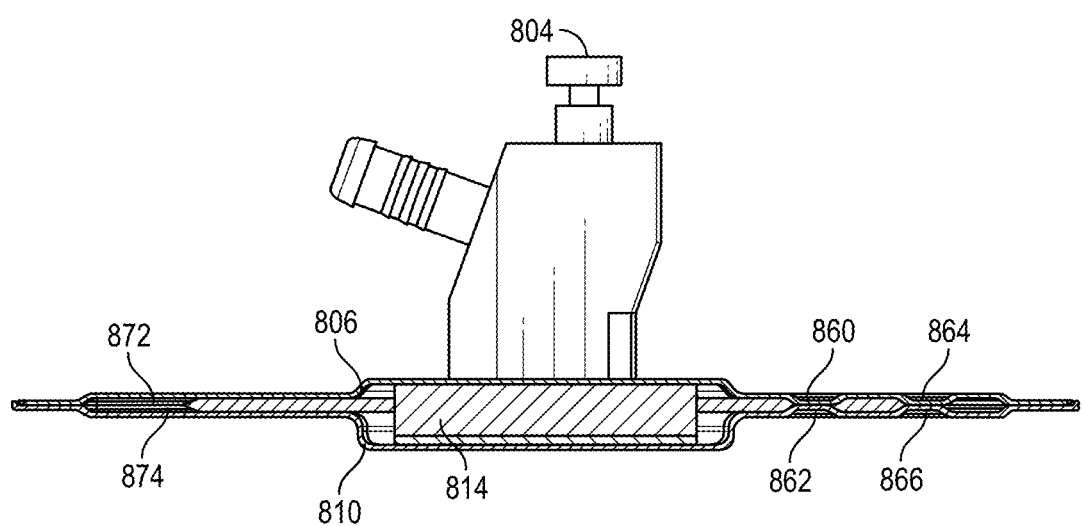
FIG. 58 shows a cross-sectional view of the flexible cold plate of FIG. 56, perpendicular to the fluid flow direction.

FIGS. 56-58 show a flexible cold plate 800 that has laterally separated, internal, parallel fluid flow paths, where flow separation is enforced by means of indentations or flow guides 860, 862, 864, 866, 868, 870, 872, 874 that are formed in top and/or bottom walls. Components of FIGS. 56-58 that are similar to those of FIGS. 1-21 are similarly numbered, but with an "8" prefix instead of a "5" or a "1," and if not described may be presumed identical to those of FIGS. 1-21.

FIG. 57 shows an internal view of the flexible cold plate 800 with top wall removed. Multiple, parallel fluid flow paths 820, 822, 840 are shown. The fluid flows from inlet 802 into the three fluid flow paths 820, 822, 840. Fluid flow path 820 is formed by the top wall 806, the bottom wall 810, an end wall 834, a flow blocker 832, and a dimple 866. The fluid flows from the inlet 802 through fluid flow path 820 to the third active area 816 and then to the outlet 804. Fluid flow path 822 is formed by the top wall, the bottom wall, the dimple 866, a dimple 862, the flow blocker 832, a flow blocker 830, a flow blocker 828, the dimple 870, and a dimple 874. The fluid flows from the inlet 802 through fluid flow path 822 to the middle active area 814 and then to the outlet 804. Fluid flow path 840 is formed by the top wall, the bottom wall, the dimple 862, the flow blocker 828, a flow blocker 826, the dimple 874, and an end wall 824. The fluid flows from the inlet 802 through fluid flow path 840 to the first active area 812 and then to the outlet 804.

FIG. 58 is a cutaway view of FIG. 56 at view line LVIII-LVIII. Multiple, parallel fluid flow paths are shown, separated by indentations 860, 862, 864, 866, 872, 874 formed in top wall 806 and bottom wall 810.

Given the discussion thus far, it will be appreciated that, in general terms, an exemplary flexible cold plate apparatus 100, according to an aspect of the invention, includes a top wall 106 and a bottom wall 110 that enclose a plenum for fluid flow; an inlet 102 and an outlet 104 each formed in one of the top wall or the bottom wall; a first active area 114 within the plenum; a second active area 116 within the plenum; and a partition 108 that extends between the top wall and the bottom wall within the plenum and that separates the first active area from the second active area so that a portion of fluid flowing from the inlet to the outlet through the plenum flows through either the first active area or the second active area but not through both active areas. Furthermore, in one or more embodiments substantially all of the fluid flowing from the inlet to the outlet flows through either the first active area or the second active area but not through both active areas.

In one or more embodiments, the major section of the partition 108 extends parallel to the planes defined by the major sections of the top and bottom walls 106, 110. In one or more embodiments, the partition includes a portion 140 or 142 bent toward one of the top wall or the bottom wall to block fluid flow through one of the active areas.

In one or more embodiments, the partition 132 or 134 extends perpendicular to the major sections of the top and bottom walls 106, 110. In one or more embodiments, the partition separates the first active area 114 from the second active area 116 so that a first flow through the first active area flows between the partition and one of the top wall or the bottom wall and a second flow through the second active area flows between the partition and the other of the top wall or the bottom wall. In one or more embodiments, the partition includes a first flow guide 140 that substantially contacts one of the top wall and the bottom wall and separates the second flow from the first active area and includes a second flow guide 142 that substantially contacts the other of the top wall and the bottom wall and separates the first flow from the second active area. In one or more embodiments, the partition is formed by the top and bottom walls touching each other. In one or more embodiments, at least one post maintains spacing between the top and bottom walls. For example, the at least one post is implemented as a dimple 550, 552, 554, or 556 in at least one of the top wall and the bottom wall. In one or more embodiments, the partition is supported between at least one post protruding upward from the bottom wall and at least one post protruding downward from the top wall. In one or more embodiments, at least a first portion 128 of the partition is formed by a fin of the first active area. In one or more embodiments, a second portion 132 of the partition is formed by a fin of the second active area. In one or more embodiments, a fin of the first active area blocks a first portion of the fluid flowing around the first active area and a fin of the second active area blocks a second portion of the fluid flowing around the second active area, and the partition blocks the first portion of the fluid flowing through the second active area and blocks the second portion of the fluid flowing through the first active area, so that substantially all of the first portion of the fluid flows through the first active area but not the second active area and substantially all of the second portion of the fluid flows through the second active area but not the first active area.

According to another aspect, an exemplary cold plate apparatus 100 includes a top wall 106 and a bottom wall 110 that enclose a plenum; an inlet 102 and an outlet 104 each formed in one of the top wall and the bottom wall and connected in fluid communication with the plenum; a first active area 114 formed in the plenum; a second active area 116 formed in the plenum; flexible portions 107, 111 of the top wall and the bottom wall that connect the first active area to the second active area; a middle wall 108 extending between the first active area and the second active area between the flexible portions of the top wall and the bottom wall; a first flow region 120 enclosed by at least the top wall and the middle wall so that fluid in the first flow region flows from the inlet to the outlet through the first active area but not through the second active area; and a second flow region 122 enclosed by at least the middle wall and the bottom wall so that fluid in the second flow region flows from the inlet to the outlet through the second active area but not through the first active area. In one or more embodiments, a post 552 protruding upward from the bottom wall 510 and a post 556 protruding downward from the top wall 506 support the middle wall 508. In one or more embodiments, the middle wall 508 comprises at least one of a protrusion 540 from the top wall toward the bottom wall and a protrusion 542 from the bottom wall toward the top wall. In one or more embodiments, the middle wall includes a feature 540 or 542 contacting one of the top wall or the bottom wall that diverts fluid flowing through the first flow region from the second active area. In one or more embodiments, the apparatus also includes a flow blocker 128, 130, 132, or 134 formed by a fin of the first active area or by a fin of the second active area, wherein the flow blocker prevents fluid bypassing the respective active area.

According to another aspect, a method for cooling electronic components includes providing a first electronic component and a second electronic component each mounted to a circuit board; positioning a cold plate apparatus with a first active area of the cold plate apparatus adjacent to the first electronic component and with a second active area of the cold plate apparatus adjacent to the second electronic component; and flowing fluid through the cold plate apparatus such that the flow is divided into separate, parallel paths wherein fluid flows within a single path through either the first active area or the second active area but not through both active areas.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A cold plate apparatus comprising:
 a top wall and a bottom wall that enclose a plenum for fluid flow;
 a middle wall that partitions a part of the plenum into an upper portion between the middle wall and the top wall and a lower portion between the middle wall and the bottom wall;
 an inlet and an outlet each formed in one of the top wall or the bottom wall;
 a first active area within the plenum and contacting the bottom wall;
 a second active area within the plenum and contacting the bottom wall;
 a first flow guide surrounding the first active area so that substantially all of a first portion of a fluid flowing from the inlet to the outlet through the plenum flows from the lower portion of the plenum through the first active area and substantially all of a second portion of the fluid flowing from the inlet to the outlet bypasses the first active area through the upper portion of the plenum; and
 a second flow guide surrounding the second active area so that substantially all of the first portion of the fluid flowing from the inlet to the outlet bypasses the second active area through the lower portion of the plenum and substantially all of the second portion of the fluid flowing from the inlet to the outlet flows from the upper portion of the plenum through the second active area.

2. The apparatus of claim 1, wherein substantially all of the fluid flowing from the inlet to the outlet flows through either the first active area or the second active area but not through both active areas.

3. The apparatus of claim 1, wherein the major section of the middle wall extends parallel to the planes defined by the major sections of the top and bottom walls.

4. The apparatus of claim 1, further comprising first fluid blockers associated with the first active area and arranged so that fluid flowing through the lower portion of the plenum does not bypass the first active area.

5. The apparatus of claim 1, further comprising second fluid blockers associated with the second active area and arranged so that fluid flowing through the upper portion of the plenum does not bypass the second active area.

6. The apparatus of claim 1, wherein at least one post maintains spacing between the top and bottom walls.

7. The apparatus of claim 6, wherein the at least one post is implemented as a dimple in at least one of the top wall and the bottom wall.

8. The apparatus of claim 1, wherein the middle wall is supported between at least one post protruding upward from the bottom wall and at least one post protruding downward from the top wall.

9. The apparatus of claim 4, wherein at least one of the first fluid blockers is formed by a fin of the first active area.

10. The apparatus of claim 5, wherein at least one of the second fluid blockers is formed by a fin of the second active area.

11. A cold plate apparatus comprising:
 a top wall and a bottom wall that enclose a plenum;
 a middle wall that partitions a part of the plenum into an upper portion between the middle wall and the top wall and a lower portion between the middle wall and the bottom wall;
 an inlet and an outlet each formed in one of the top wall and the bottom wall and connected in fluid communication with the plenum;
 a first active area within the plenum and contacting the bottom wall;
 a second active area within the plenum and contacting the bottom wall;
 flexible portions of the top wall and the bottom wall that connect the first active area to the second active area;
 a first flow guide enclosing the first active area so that fluid in the lower portion of the plenum flows from the inlet to the outlet through the first active area but fluid in the upper portion of the plenum does not flow through the first active area;
 a second flow guide enclosing the second active area so that fluid in the upper portion of the plenum flows from the inlet to the outlet through the second active area but fluid in the lower portion of the plenum does not flow through the second active area;
 a first electronic component adjacent to the first active area and dissipating heat into the first active area through the bottom wall; and
 a second electronic component adjacent to the second active area and dissipating heat into the second active area through the bottom wall.

12. The apparatus of claim 11, wherein a post protruding upward from the bottom wall and a post protruding downward from the top wall support the middle wall.

13. The apparatus of claim 11, wherein the middle wall comprises at least one of a protrusion from the top wall toward the bottom wall and a protrusion from the bottom wall toward the top wall.

14. The apparatus of claim 11, further comprising a feature contacting the top wall that diverts fluid flowing through the from upper portion of the plenum into the second active area.

15. The apparatus of claim 11, further comprising a a feature contacting the bottom wall that diverts fluid flowing through the lower portion of the plenum into the first active area.

16. A method for cooling electronic components, comprising:
   providing a first electronic component and a second electronic component each mounted to a circuit board;
   positioning a cold plate apparatus with a first active area of the cold plate apparatus adjacent to the first electronic component and with a second active area of the cold plate apparatus adjacent to the second electronic component, wherein the cold plate apparatus has a top wall and a bottom wall that enclose a plenum, and a middle wall that partitions the plenum into upper and lower portions, wherein the first active area and the second active area are in the lower portion of the plenum; and
   flowing fluid through the cold plate apparatus such that the flow is divided into a first portion that flows through the first active area and then bypasses the second active area through the lower portion of the plenum and into a second portion that bypasses the first active area through the upper portion of the plenum and then flows through the second active area.

* * * * *